(12) United States Patent
Poisner (10) Patent No.: US 7,000,056 B2
(45) Date of Patent: Feb. 14, 2006

(54) METHOD AND APPARATUS FOR DETECTING LOW PIN COUNT AND SERIAL PERIPHERAL INTERFACES

(75) Inventor: David I. Poisner, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 10/402,779

(22) Filed: Mar. 28, 2003

(65) Prior Publication Data

US 2004/0205274 A1    Oct. 14, 2004

(51) Int. Cl.
G06F 13/40    (2006.01)
G06F 13/42    (2006.01)

(52) U.S. Cl. .................................. 710/305; 710/105

(58) Field of Classification Search ............ 710/38, 710/305, 306, 100, 315, 105; 370/401–402, 370/537, 362; 712/33; 713/501; 714/37

See application file for complete search history.

(56) References Cited

U.S. PATENT DOCUMENTS

| | | | | |
|---|---|---|---|---|
| 4,694,394 | A | * | 9/1987 | Costantini ..................... 712/38 |
| 5,640,541 | A | * | 6/1997 | Bartram et al. ................. 703/26 |
| 6,073,201 | A | * | 6/2000 | Jolley et al. .................. 710/315 |
| 6,191,480 | B1 | | 2/2001 | Kastberg et al. |
| 6,408,347 | B1 | | 6/2002 | Smith et al. |
| 6,485,320 | B1 | | 11/2002 | Ma |

FOREIGN PATENT DOCUMENTS

| | | |
|---|---|---|
| EP | 0 424 658 A2 | 5/1991 |
| EP | 0 779 582 A1 | 6/1997 |
| WO | WO 96/17301 | 6/1996 |

OTHER PUBLICATIONS

"A comparison of five different multiprocessor SoC bus architectures" by Kyeong Keol Ryu; Eung shin; Moomey, , V.J. (abstract only) Publication Date Sep. 4-6, 2001.*
U.S. Appl. No. 08/581,378: A Method and Apparatus for Automatically Detecting Whether a Memory Unit Location is Unpopulated or Populated with Synchronous or Asynchronous Memory. Specification and abstract pp. 2-34. Figures 1, 2, 3A and 3B. Inventors: Narenda S. Khandekar and Aniruddha Kundu.
PCT International Search Report, International application No. PCT/US2004/004220, Jan. 12, 2005, 4 pages.

* cited by examiner

Primary Examiner—Gopal C. Ray
(74) Attorney, Agent, or Firm—Blakely, Sokoloff, Taylor & Zafman LLP (57) ABSTRACT

Apparatus and method for providing a multiplexed bus supporting the coupling of either one of a device having a first bus type interface and a device having a second bus type interface where the multiplexed bus is made up, at least in part, of a plurality of common signal lines that may be coupled to either type of device, and that may be used to carry out transfers with protocols and timings for either bus.

13 Claims, 6 Drawing Sheets

METHOD AND APPARATUS FOR DETECTING LOW PIN COUNT AND SERIAL PERIPHERAL INTERFACES

BACKGROUND

Computer systems continue to become ever more compact while also becoming ever more capable, and this is at least partially driven by each of the components of computer systems continuing to perform an ever increasing variety of functions. Specifically, the integrated circuits (ICs) of computer systems continue to be designed to incorporate ever more features and options to offer to the manufacturers of the computer systems in which these ICs are used.

A recurring problem for manufacturers of both the ICs and the computer system circuitboards to which the ICs are attached is providing support for increasing quantities of signal pins that must be provided for the ICs for the ever growing number of features and options. Ever increasing quantities of pins require ever more expensive IC packaging that can provide ever more pins. Furthermore, for the sake of compactness and maintaining short internal conductor lengths, these more expensive IC packages usually position these larger quantities of pins in ever denser concentrations, requiring ever denser placement of conductive traces and solder pads (or other conductive solder locations) on circuitboards, thereby increasing circuitboard costs. Given the added costs and complexities of adding more pins to an IC package, it is desirable to find ways to limit the number of pins a given IC requires.

A common way to limit the number of pins is to make tradeoffs between functions and the quantity of pins, and usually, this results in limiting the functions to be carried out by a given IC, and perhaps placing some functions into a different IC, which may increase the quantity of ICs in a given electronic device. However, a recurring goal for the design and building of computer systems is to drive down costs and increase reliability by reducing the overall quantity of components used in a computer system, including ICs.

DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Embodiments of the present invention concern incorporating support for two different bus interfaces into an IC by multiplexing much of the two bus interface functions onto the same pins of an IC to avoid having to allocate the higher quantity of pins that would otherwise be required to support the two busses with entirely separate sets of pins. Although the following discussion centers on bus interfaces to nonvolatile memory devices, it will be understood by those skilled in the art that the invention as hereinafter claimed may be practiced in support of two or more busses used for any of a number of purposes. Also, although the following discussion centers on ICs within computer systems, it will be understood by those skilled in the art that the invention as hereinafter claimed may be practiced in connection with other electronic devices having electronic components supporting attachment to multiple busses.

Figure 1:
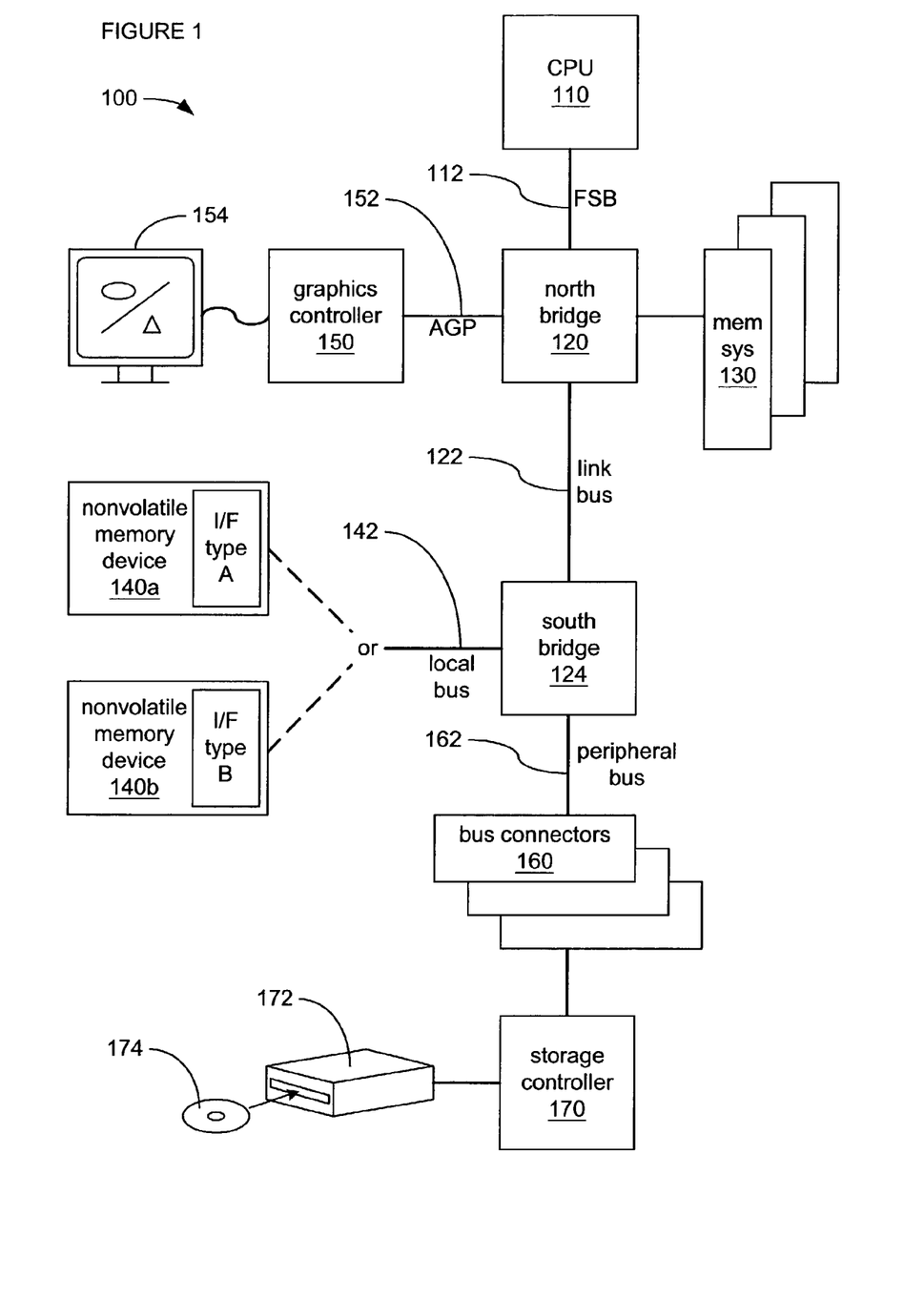
FIG. 1 is a block diagram of one embodiment employing a computer system.

FIG. 1 is a block diagram of one embodiment employing a computer system. Computer system 100 is, at least in part, made up of central processing unit (CPU) 110, front side bus (FSB) 112, north bridge logic 120, link bus 122, south bridge logic 124, memory system 130, graphics controller 150, advanced graphics port (AGP) bus 152, display 154, peripheral bus connectors 160, peripheral bus 162, storage controller 170, storage drive 172, storage media 174, multiplexed bus 142 and one or both of nonvolatile memory devices 140a and 140b.

CPU 110, FSB 112, north bridge logic 120 and memory system 130 make up a form of core of computer system 100 capable of executing machine readable instructions. CPU 110 is coupled to north bridge logic 120 via FSB 112, and performs various functions in support of CPU 110 including controlling and providing CPU 110 with access to memory system 130 to which north bridge logic 120 is also coupled. In various embodiments, CPU 110 could be any of a variety of types of CPU including a CPU capable of executing at least a portion of the widely known and used "x86" instruction set, and in other various embodiments, there could be more than one CPU. In various embodiments, memory system 130 could be any of a variety of types of random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc.

Graphics controller 150, AGP bus 152 and display 154 make up a form of display system capable of providing a visual user interface for a user of computer system 100. AGP bus 152 is a high speed parallel bus coupling north bridge logic 120 to graphics controller 150, and in various embodiments, north bridge logic 120 is configured to provide a very low latency data path between graphics controller 150 and memory system 130. Graphics controller 150 is further coupled to display 154, and controls display 154 to provide a visual image.

South bridge logic 124, which is coupled to north bridge logic 120 via link bus 122, may provide one or both of multiplexed bus 142 and peripheral bus 162 by which further devices may be coupled to add functionality to computer system 100. Peripheral bus 162 is a higher speed and more general purpose bus than multiplexed bus 142, and is designed to support the coupling of more complex devices capable of supporting and making fuller use of the wide range of capabilities provided by peripheral bus 162. Multiplexed bus 142 is slower speed and simpler bus than peripheral bus 162, and is designed to support the additional of less complex devices, allowing various forms of simpler I/O port logic, memory devices, timers, etc., to be added to augment the functionality of computer system 100.

In various embodiments, further devices may be directly coupled to peripheral bus 162, and in various embodiments, peripheral bus 162 may be implemented with one or more of connectors 160 to provide a way by which further devices may be removably coupled to peripheral bus 162. In various embodiments, peripheral bus 162 may be designed to conform to any of a variety of widely known forms of busses that have become "standardized" in art of computer design, such as extended industry standard architecture (EISA), Micro Channel™ architecture (MCA), peripheral component interconnect (PCI), PCI-X, etc.

In various embodiments, a device that may be coupled to computer system 100 through peripheral bus 162 and/or bus connectors 160 (as well as through any of a variety of other forms of coupling) is storage controller 170, which is in turn coupled storage drive 172. Storage controller 170 provides logic to control storage drive 172 by which data and/or instructions carried by storage media 174 may be accessed. Indeed, in some embodiments, storage media 174 carries machine-accessible instructions to be executed by CPU 110 to cause CPU 110 to determine the presence or absence of one or both of nonvolatile memory devices 140a and 140b, as will be described. Storage media 174 may of any of a wide variety of types and technologies as those skilled in the art will understand, including CD or DVD ROM, magnetic or optical diskette, magneto-optical disk, tape, semiconductor memory, characters or perforations on paper or other material, etc.

When computer system 100 is first powered up or is initialized (for example, by "resetting" computer system 100, etc.), it is common practice for CPU 110 to attempt to find initial instructions (sometimes referred to variously as either "firmware," "ROM code," "basic input/output system" or "BIOS") to execute at a predetermined memory address. It is also common practice to store such initial instructions in a nonvolatile memory device, such as either of nonvolatile memory devices 140a or 140b. As depicted in FIG. 1, either of nonvolatile memory devices 140a or 140b may be coupled to south bridge logic 124 via multiplexed bus 142, however, as also depicted in FIG. 1, each of nonvolatile memory devices 140a and 140b have a different interface. Specifically, nonvolatile memory device 140a has a "type A" interface while nonvolatile memory device 140b has a "type B" interface. In many possible different embodiments, there could be any of a number of possible specific differences between the type A and B interfaces. These differences could be in timing, endian arrangement of bytes, open-collector versus tri-state signaling, command protocol, parallel versus serial data transmission, etc. As depicted in FIG. 1, south bridge logic 124 provides a single multiplexed bus 142 configured to accommodate either of the type A or B interfaces, thereby allowing either of nonvolatile memory devices 140a or 140b to be used with computer system 100 through multiplexed bus 142 and south bridge logic 124.

To allow the attachment of devices with different interfaces, such as interface types A and B of nonvolatile memory devices 140a and 140b, south bridge logic 124 includes interface logic to query devices coupled to multiplexed bus 142 to identify the type(s) of interfaces used by those devices, as well as to carry out bus transactions with the differing interfaces found in those devices. Multiplexed bus 142 and this interface logic are designed to support differing interfaces largely through multiplexing of signals needed to support differing interfaces on to pins of south bridge logic 124 such that there is a subset of pins of south bridge logic 124 that are coupled to more than one differing interface, thereby allowing multiple differing interfaces to be supported without the use of additional pins from south bridge logic 124 to provide entirely separate sets of pins for each of the differing interfaces. Specifically, a subset of the pins of south bridge logic 124 that make up multiplexed bus 142 are coupled to both interface types A and B of nonvolatile memory devices 140a and 140b such that additional pins of south bridge logic 124 are not used to provide entirely separate interfaces for interface types A and B.

In various embodiments, multiplexed bus 142 may be configured to accommodate interface types A and B, simultaneously, allowing both devices with type A and devices with type B interfaces to be coupled to bus 142, simultaneously. Alternatively, multiplexed bus 142 may be configured to support either of interface types A and B, but not to support the attachment of both devices having type A and devices having type B interfaces at the same time. Also, although not shown in FIG. 1 for sake of clarity, some embodiments of multiplexed bus 142 may be configured to support devices performing functions other than storage of instructions, such as devices providing computer system 100 with interfaces for keyboards, mice, printers, modems, infrared transceivers, etc., in addition to supporting the coupling of one or both of nonvolatile memory devices 140a and 140b.

Although computer system 100 has been depicted and described with various specific details, such as allocation of functions among various ICs, arrangement and type of busses, and quantities of various components, those skilled in the art will readily recognize that computer system 100 is but one example of a great many possible architectures and implementations of a computer system. Computer system 100 is but one specific implementation of a computer system, and it will be apparent to those skilled in the art that such details of a computer system are irrelevant to the spirit and scope of the invention as hereinafter claimed.

Figure 2:
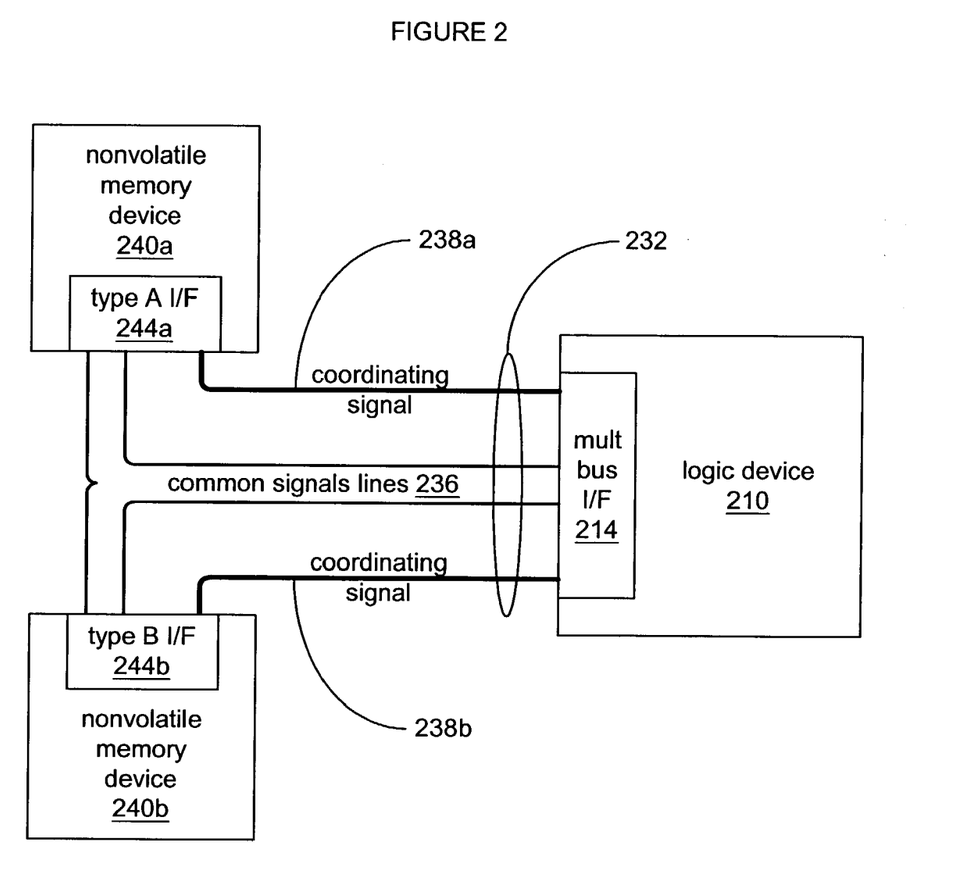
FIG. 2 is a block diagram of an embodiment of logic providing a multiplexed bus.

FIG. 2 is a block diagram of an embodiment of logic providing a bus interface. Logic device 210 is a component of a larger electronic device, such as a computer system. Specifically, logic device 210 could, in some embodiments of computer system, be a south bridge logic device or other component of a computer system to which one or more busses are coupled. Logic device 210 is at least in part made up of multiplexed bus interface 214 through which logic device 210 transmits and receives signals through bus multiplexed bus 232 to and from one or both of type A interface 244a and type B interface 244b of nonvolatile memory devices 240a and 240b, respectively.

Multiplexed bus 232 is made up of common signal lines 236 that may be shared between all three of multiplexed bus interface 214, type A interface 244a and type B interface 244b.40a and 240b; coordinating signal 238a through which multiplexed bus interface 214 coordinates bus activity between multiplexed bus interface 214 and type A interface 244a; and coordinating signal 238b through which multiplexed bus interface 214 coordinates bus activity between multiplexed bus interface 214 and type B interface 244b. In essence, multiplexed bus interface 214 provides a multiplexed bus, namely multiplexed bus 232, that combines signals and functionality from both a bus type A to which type A interface 244a was designed to be coupled and a bus type B to which type B interface 244b was designed to be coupled, that seeks to multiplex at least some of the signals of both bus types A and B onto a common set of signal lines that can be shared by both type A interface 244a and type B interface 244b, and that coordinates the multiplexed activity on the common set of signal lines via coordinating signals 238a and 238b.

Which signal (or even signals) out of bus type A is used as coordinating signal 238a depends on the characteristics of the signals and protocols of bus type A. For instance, if the protocols of bus type A are such that interfaces designed to work with bus type A are required to tri-state multiple signals when a given chip select or other control input is inactive, then that control input may be used as coordinating signal 238a. Alternatively, if the protocols of bus type A are such that interfaces designed to work with bus type A are required to tri-state multiple signals when a certain number of clock pulses on a clock input occur without some particular form of activity taking place on other signal lines, then that clock input may be used as coordinating signal 238a. Similar examples could also apply for coordinating signal 238b. Also, if an interface designed to work with bus type A normally tri-states a number of its signals when the interface is not engaged in bus activity, while an interface designed to work with bus type B uses a number of signals designed to be tied to an open-collector bus, it may still be possible to multiplex a number of the tri-statable signals of bus type A with a number of the open-collector signals of bus type B so long as appropriate pull-up and/or pull-down resistors are employed as needed to make this multiplexing possible.

As those skilled in the art will recognize, what is depicted in FIG. 2 is somewhat simplified in the sense that, depending on the electrical characteristics of the individual signals and the times at which they are expected to be active and inactive for bus types A and B, it may be that more than just coordinating signals 238a and 238b couple multiplexed bus interface 214 to only one or the other of type A interface 244a and type B interface 244b. This also arises out of the likelihood that bus types A and B does not each require the use of an identical quantity of signal lines, and therefore, either one of type A interface 244a or type B interface 244b is likely to have some greater quantity of signals coupled to multiplexed bus interface 214 than the other.

Figure 3:
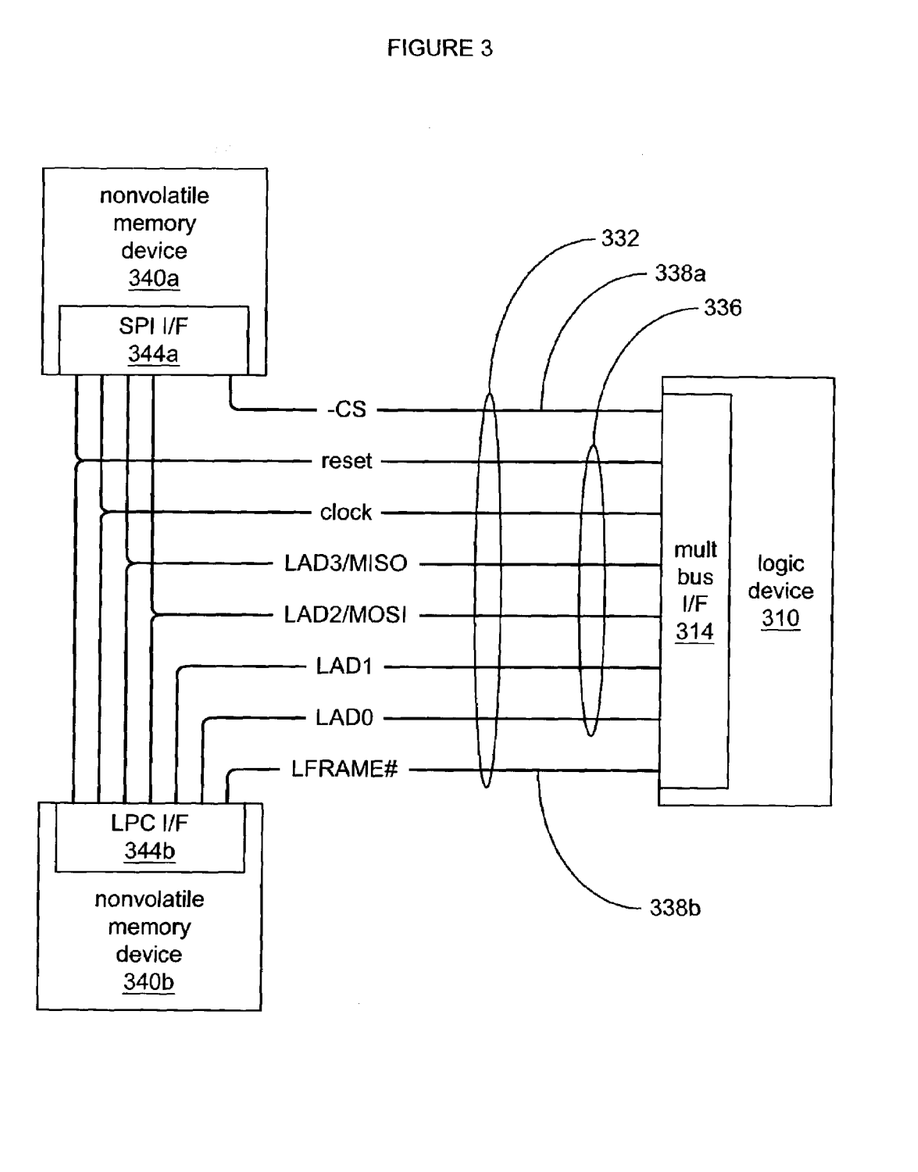
FIG. 3 is a more specific block diagram of an embodiment of logic providing a multiplexed bus.

FIG. 3 is a more detailed block diagram of an embodiment of logic providing a bus interface showing more specific signal details. Like logic device 210 of FIG. 2, logic device 310 is a component of a larger electronic device, such as a computer system, and could, in some embodiments of computer system, be a south bridge logic device or other component of a computer system to which one or more busses are coupled. Logic device 310 is at least in part made up of multiplexed bus interface 314 providing multiplexed bus 332 which is able to support the protocols and timings of both the serial peripheral interface (SPI) and low pin count (LPC) busses. Multiplexed interface transmits and receives signals through multiplexed bus 332 to and from one or both of SPI interface 344a and LPC interface 344b of nonvolatile memory devices 340a and 340b, respectively. As will become clear from the following discussion, multiplexed bus interface 314 and multiplexed bus 332 are meant to accommodate the coupling of both an LPC device and an SPI device to multiplexed bus 332, simultaneously, if desired.

Multiplexed bus interface 314 provides bus 332 having characteristics that permit devices designed to interface to either of the widely known SPI or LPC busses to be coupled to bus 332. SPI was introduced by Motorola, Inc., and has become widely used in microcontroller applications for the attachment of numerous types of devices including EEPROMs, DSPs and LED numeric display drivers. With a current data rate of up to 20 Mbps and current talk in the industry of increasing the data rate up to 25 Mbps, SPI is seen as the successor to the long familiar I2C bus. LPC was introduced by Intel Corporation, and has become widely used in personal computer applications for the attachment of numerous types of devices including flash ROMs and I/O controller chips providing interfaces to user interface devices. Having a data rate currently as high as 16.5 MB/sec, LPC is widely used as an alternative to such busses as ISA which have provided comparable data rates, but which require many more signals, and therefore, many more pins on an IC making up part of a personal computer.

Of the signals making up multiplexed bus 332, -CS 338a and LFRAME# 338b are coordinating signals used by multiplexed bus interface 314 to coordinate bus activity between multiplexed bus interface 314 and each of SPI interface 344a and LPC interface 344b. Those familiar with SPI bus will recognize that -CS 338a is the "chip select" signal of SPI bus, and that other signals of a slave device (such as nonvolatile memory device 340a) are tri-stated and ignored by the interface of such a slave device (such as SPI interface 344a) when its -CS input is driven inactive (i.e., high). Those familiar with LPC bus will recognize that LFRAME# 338b is the signal that "frames" the start and end of a valid transfer of addresses, commands and data on LPC bus, and that other signals of a peripheral device (such as nonvolatile memory device 340b) are tri-stated and ignored by the interface of such a peripheral device (such as LPC interface 344b) when its LFRAME# input is driven inactive (i.e., high). Multiplexed bus interface 314 uses -CS 338a and LFRAME# 338b to select one or the other of nonvolatile memory devices 340a and 340b, respectively, to engage in bus activity and to prevent bus conflicts between nonvolatile memory devices 340a and 340b.

With -CS 338a and LFRAME# 338b serving as coordinating signals, the remaining signals make up a set of non-coordinating signals 336. Depicted among non-coordinating signals 336 is a reset signal routed to both SPI interface 344a and LPC interface 344b. The LPC interface specifically provides for a reset signal (called LRESET#) to convey a reset signal to a device attached to an LPC bus whenever other components of a computer system in which the LPC bus is present are also reset. However, as those skilled in the art will recognize, it is conceivable that a particularly simple device attached to an LPC bus, such as nonvolatile memory device 340b, may not require a reset signal. The SPI interface does not specifically provide for any form of reset signal, however, it is conceivable that a complex device attached to an LPC bus (likely a device more complex than nonvolatile memory device 340a) may require a reset signal. Various possible embodiments of multiplexed bus interface 314 may or may not provide a reset signal to devices attached to multiplexed bus 332. Also, various possible embodiments of a computer system or other electronic device in which multiplexed bus interface 314 and multiplexed bus 332 are present may have other logic or another bus from which a reset signal could be provided in lieu of multiplexed bus interface 314 providing it.

Also depicted among non-coordinating signals 336 is a clock signal routed to both SPI interface 344a and LPC interface 344b. Both the SPI and LPC busses require a clock signal (called either SCK or SCLK in SPI, and called LCLK in LPC) to synchronize the transfer of addresses, commands and data across both busses. Depending on the specific requirements of data rates for each of nonvolatile memory devices 340a and 340b and the specific design of multiplexed bus interface 314, it may be possible to use the same clock signal to synchronize both SPI and LPC types of bus activity on multiplexed bus 332. Specifically, although SPI currently supports a clock up to 20 MHz (though 25 MHz has currently been proposed as a new maximum clock rate), in some embodiments, it may be that nonvolatile memory device 340a is unable to transfer data at a rate that would make full use of such a clock. Similarly, in some embodiments, it may be that nonvolatile memory device 340b is unable to transfer data at a rate that would make full use of the maximum 33 MHz clock currently supported by LPC. In some embodiments, this sharing of a clock signal could entail designing the logic of multiplexed bus interface 314 to be capable of supplying a clock of varying frequency whereby the clock signal would switch between two different frequencies (such as SPI's current 20 MHz and LPC's current 33 MHz) depending on the type of bus activity taking place. In other embodiments, a common clock frequency is chosen and used for both SPI and LPC types of bus activity (such as SPI's possible future maximum clock rate of 25 MHz), with the result that at least one or the other of these two types of bus activity is synchronized to a clock that is slower than maximum possible for that type of bus activity. Otherwise, in other embodiments, it may be desirable to optimize the data transfer rates for both LPC and SPI devices, as well as maintain some degree of simplicity of design for multiplexed bus interface 314, by providing separate clock signals to both nonvolatile memory devices 340a and 340b.

Non-coordinating signals 336 are also depicted as including LAD0 through LAD3, which make up the parallel bidirectional nibble-wide set of signals by which addresses, commands and data are transferred on an LPC bus. As depicted, LAD2 and LAD3 have been multiplexed with MISO and MOSI, which make up the master-in-slave-out and master-out-slave-in unidirectional serial signals by which addresses, commands and data are transferred on an SPI bus, resulting in the multiplexed LAD2/MOSI and LAD3/MISO signals. As those skilled in the art will readily recognize, other forms of multiplexing these LPC and SPI transfer signals may be resorted to in which different combinations of such signals are created without departing from the spirit and scope of the invention as hereinafter claimed.

Figure 4:
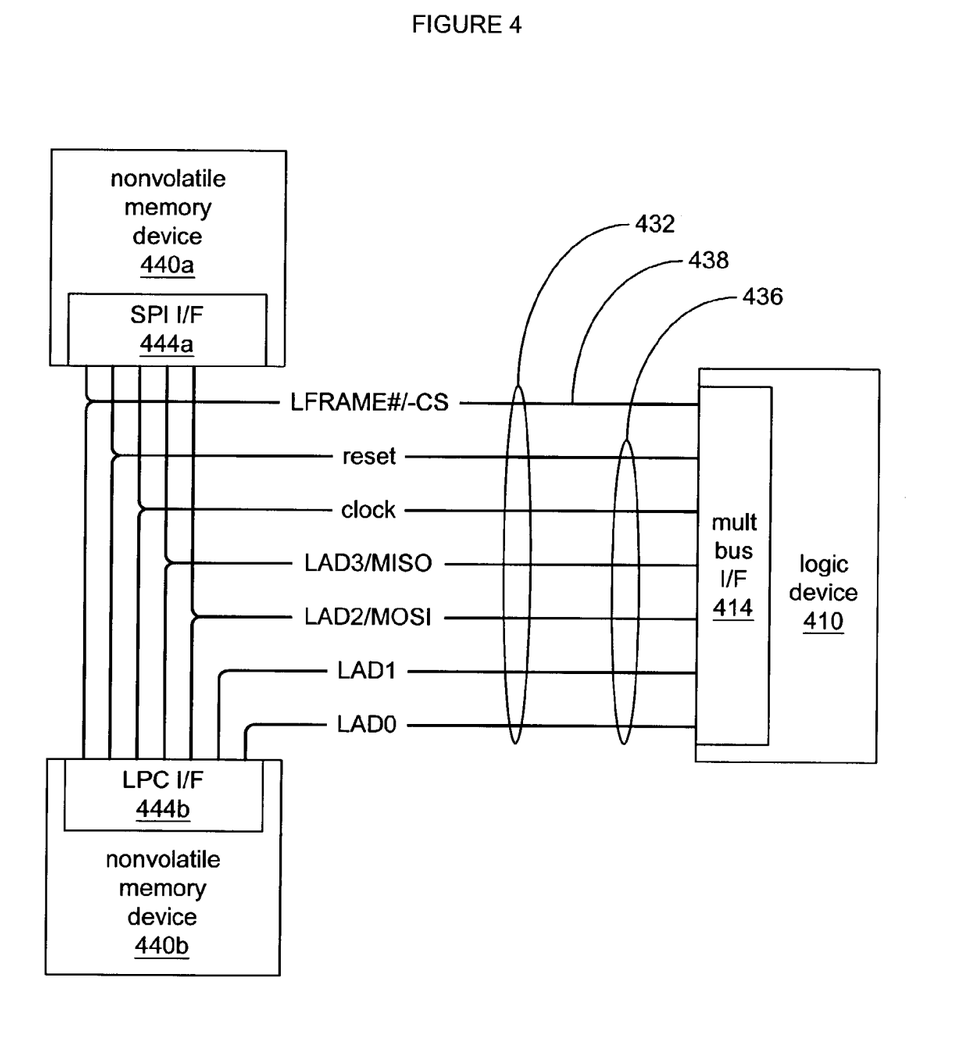
FIG. 4 is a more specific block diagram of another embodiment of logic providing a multiplexed bus.

Determining the presence or absence of LPC and/or SPI devices could be accomplished by multiplexed bus interface 414 carrying out one or more operations on multiplexed bus 432 to query for the presence of LPC and/or SPI devices. In varying embodiments, multiplexed bus interface 414 may attempt to carry out one or more read operations, first using one of either the LPC or SPI protocols, and upon failing to get a response, subsequently using the other of the two protocols. The provision of -CS signal 338a separate from LFRAME# signal 338b allows the attempted read operations to be carried out to find devices having one of the two interfaces without interference from devices having the other of the two interfaces.

FIG. 4 is a more detailed block diagram of another embodiment of logic providing a bus interface showing more specific signal details. Like logic devices 210 and 310 of FIGS. 2 and 3, logic device 410 is a component of a larger electronic device, such as a computer system, and could, in some embodiments of computer system, be a south bridge logic device or other component of a computer system to which one or more busses are coupled. Similarly logic device 310, logic device 410 is at least in part made up of multiplexed bus interface 414 through which logic device 410 transmits and receives signals through bus multiplexed bus 432 to and from only one or the other of SPI interface 344a and LPC interface 344b of nonvolatile memory devices 340a and 340b, respectively. Unlike multiplexed bus interface 314 and multiplexed bus 332 which could accommodate the coupling of both an LPC device and an SPI device to multiplexed bus 332, simultaneously, multiplexed bus interface 414 and multiplexed bus 432 are meant to accommodate the coupling of only one or the other of an LPC or SPI device to multiplexed bus 432 at any one time.

A principal difference between multiplexed bus 332 of FIG. 3, and multiplexed bus 432 is the multiplexing of the LFRAME# signal of LPC bus onto the same signal line as the -CS signal of SPI bus, creating LFRAME#/-CS signal 438. This removes the need for logic device 410 to provide the additional pin to allow these two signals to be on separate signal lines, but this brings about the result stated earlier that multiplexed bus 432 can accommodate either an LPC device or an SPI device, but not both, simultaneously. Determining whether or not an LPC device or an SPI device is attached, and thereby determining whether multiplexed bus 432 should be controlled by multiplexed bus interface 414 as an LPC bus or as an SPI bus, could be accomplished by multiplexed bus interface 414 carrying out one or more operations on multiplexed bus 432 to query for the presence of LPC and/or SPI devices.

In one embodiment, multiplexed bus interface 414 attempts to carry out one or more read operations via SPI bus protocols and timings using LFRAME#/-CS signal 438, along with the clock, LAD2/MOSI and LAD3/MISO signals out of non-coordinating signals 436. If an SPI device (such as nonvolatile memory device 440a with its SPI interface 444a) is present, then multiplexed bus interface 414 should receive one or more bytes of some form of data, commands, etc. from that SPI device via the LAD3/MISO signal. Given that the LPC bus requires that the LAD0 through LAD3 signals have pullup resistors, the lack of an SPI device being present should result in the receipt of all 1s on every bit from LAD3/MISO by multiplexed bus interface 414. However, to further ensure that no SPI device is present, in some embodiments, it may be deemed desirable to make the pullup resistor for LAD3/MISO switchable such that LAD3/MISO may be subjected to being pulled down and the attempted read operation(s) repeated. If there is no SPI device present, then the result should be the receipt of all 0s on every bit from LAD3/MISO by multiplexed bus interface 414. If an SPI device is found, then multiplexed bus 432 would be subsequently operated as an SPI bus. However, if no SPI device is found, then in various possible embodiments, either the presence of an LPC device could be presumed, or a read or other operation could be performed on multiplexed bus 432 using the LPC protocol to confirm the presence of an LPC device.

In one embodiment, multiplexed bus interface 414 attempts to carry out one or more read operations via LPC bus protocols and timing using LFRAME#/-CS signal 438, along with all of the signals out of non-coordinating signals 436. However, as a precaution against causing a possible short between multiplexed bus interface 414 and an SPI device that might be present, multiplexed bus interface 414 may be designed to actually drive the LAD3/MISO using a pullup or pulldown resistor (perhaps even simply making use of the pullup resistor already required for the LAD3 signal by the LPC standard). Also, to ensure that an SPI device that might be present is able to respond correctly, the clock signal might, in some embodiments, be driven at a clock rate of 20 MHz or lower, instead of a clock rate approaching the 33 MHz maximum provided for by LPC. If an LPC device (such as nonvolatile memory device 440b with its SPI interface 444b) is present, then multiplexed bus interface 414 should receive a valid SYNC byte from the LPC device across LAD0, LAD1, LAD2/MOSI and LAD3/MISO. If an SPI device is present, then multiplexed bus interface 414 should receive one or more bytes of some form of data, commands, etc. from that SPI device via the LAD3/MISO signal. If no device is present, and the normal pullup resistors required by LPC on the LAD0 through LAD3 signals are being maintained, then multiplexed bus interface 414 should receive nothing but all 1s across LAD0, LAD1, LAD2/MOSI and LAD3/MISO.

Still other embodiments of testing for the presence of SPI or LPC devices are possible, as those skilled in the art will readily recognize. Some possible ways of testing for such devices may be chosen that take advantage of knowledge of aspects of a design of a computer system or electronic device in which logic device 410 is installed of what signals are actually made available for given LPC or SPI devices from multiplexed bus interface 414 via the circuitboard(s) to which logic device 410 is coupled. For example, if it is known that the reset signal will be routed only to an LPC device, if an LPC device is present, and not to an SPI device, then the reset signal may be manipulated through multiplexed bus interface 414 to ensure that any LPC device that might be present is caused to give no response as tests are conducted for the presence of SPI devices, or vice versa if it is known that only an SPI device would receive the reset signal.

Although multiplexed bus interfaces 214, 314 and 414 of FIGS. 2, 3 and 4, respectively, are depicted as having been integrated or otherwise "built in" to other depicted logic devices to provide access between those other logic devices and depicted multiplexed busses, it will be understood by those skilled in the art that multiplexed bus interfaces 214, 314 and/or 414 may be implemented as stand-alone devices in any of a wide variety of possible embodiments. Specifically, those skilled in the art will recognize that multiplexed bus interfaces 214, 314 and 414 may provide access to accompanying multiplexed busses to other devices from across still another bus or busses without departing from the spirit or scope of the invention as hereinafter claimed. Furthermore, those skilled in the art will readily appreciate that in various embodiments, multiplexed bus interfaces 214, 314 and 414 may determine the presence and/or absence of various devices with various types of interfaces across accompanying multiplexed busses either autonomously via an internal microcontroller, internal CPU, hard-wired logic, programmable logic, etc., or under the control of another device external to multiplexed bus interfaces 214, 314 and/or 414, such as, for example, a CPU of a computer system or other electronic device into which multiplexed bus interfaces 214, 314 and/or 414 are somehow incorporated. Also, in embodiments where multiplexed bus interfaces 214, 314 and/or 414 determine the presence and/or absence of various devices with various types of interfaces across accompanying multiplexed busses through an internal CPU, microcontroller, or similar processing device executing instructions, the machine-accessible instructions that are executed to carry out that determination of presence or absence of devices may be read from a media such as, for example, storage media 174 of FIG. 1.

Figure 5:
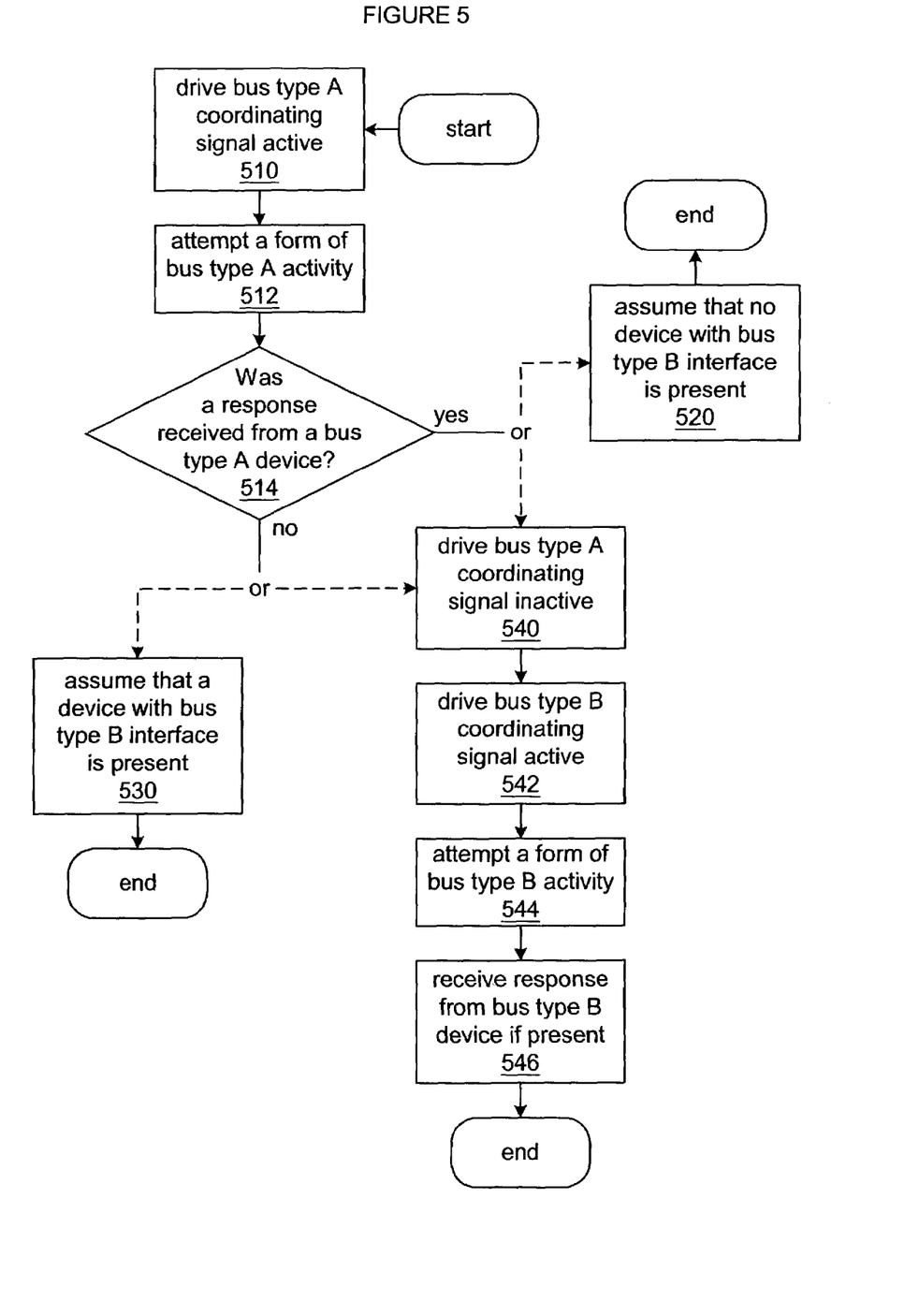
FIG. 5 is a flow chart of an embodiment.

FIG. 5 is a flow chart of an embodiment. An effort to determine if a device with an interface for bus type A is attached to a multiplexed bus able to support either devices having an interface for bus type A or devices having an interface for bus type B begins at 510 by driving a coordinating signal for bus type A (for example, coordinating signal 238a of FIG. 2) active. At 512, an attempt is made to carry out some form of bus activity using the bus type A protocols, such as a read operation. If at 514, a response was received from a device having a bus type A interface, then either the assumption can be made that there is no device present on the multiplexed bus with a device type B interface at 520, or testing for a device with a bus type B interface can commence at 540. Otherwise, if at 514, no response was received from a device having a bus type A interface, then either the assumption can be made at 530 that a device having a bus type B interface is present, or testing for the presence of a device with a bus type B interface on the multiplexed bus can commence at 540. If testing for a device with a bus type B interface on the multiplexed bus is to occur, then the same coordinating signal for bus type A that was driven active at 510 is driven inactive at 540. At 542, a coordinating signal for bus type B (for example, coordinating signal 238b of FIG. 2) is driven active. At 544, an attempt is made to carry out some form of bus activity using the bus type B protocols, followed by receiving a response from a device having a bus type B interface from across the multiplexed bus, if such a device is present at 546.

Figure 6:
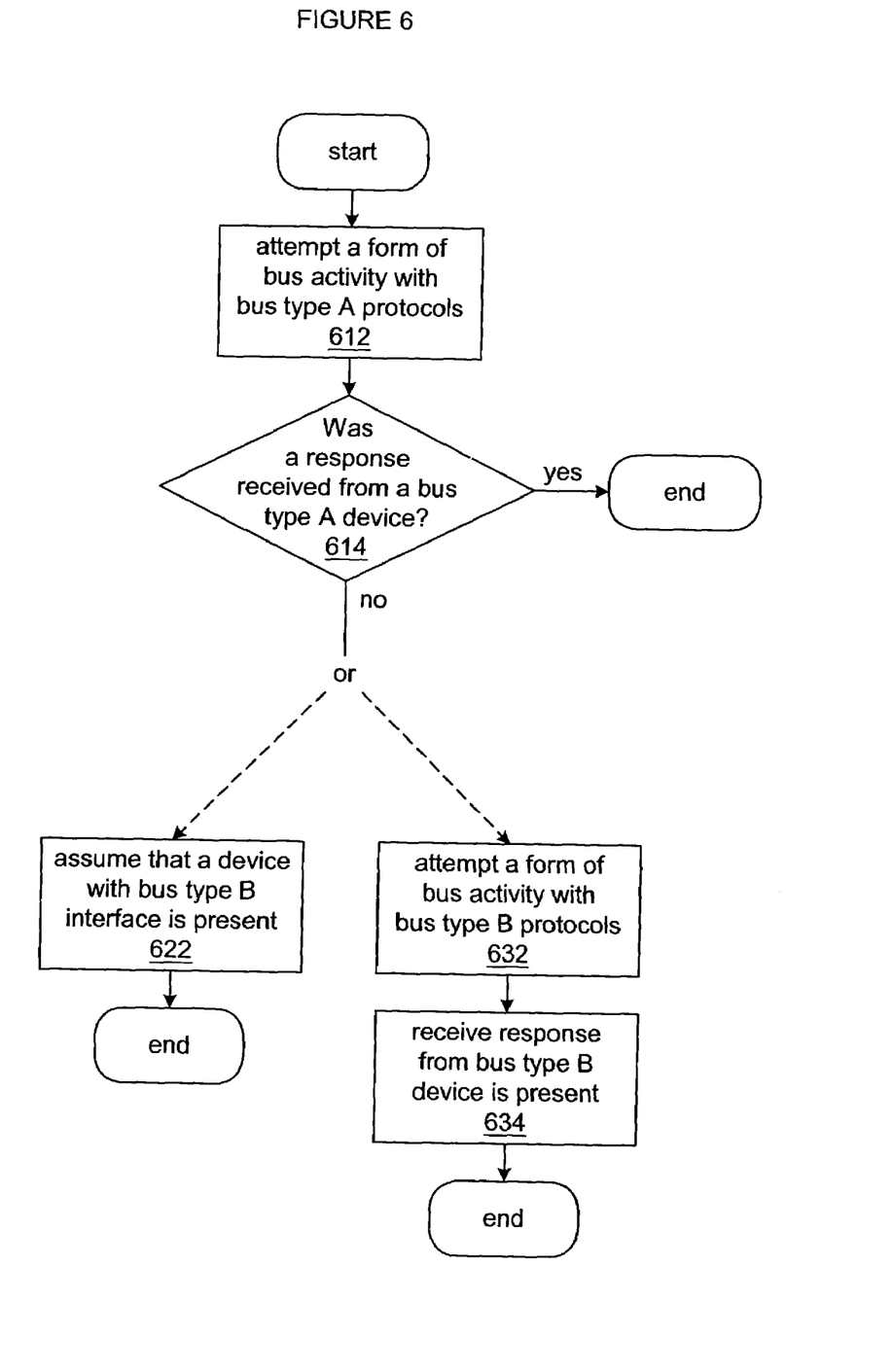
FIG. 6 is a flow chart of another embodiment.

FIG. 6 is a flow chart of another embodiment. An effort to determine if a device with an interface for bus type A is attached to a multiplexed bus able to support either devices having an interface for bus type A or devices having an interface for bus type B (but not both types, simultaneously) begins at 612 by attempting to carry out some form of bus activity using the bus type A protocols, such as a read operation. The effort at locating devices could end at 614, if a response is received from a device having a bus type A interface from across the multiplexed bus. However, if no response is received from a device having a bus type A interface, then in some variations of this embodiment, the assumption could be made, at 622, that a device with an interface for bus type B must be present. Alternatively, in other variations of this embodiment, an effort could be made to find a device with a bus type B interface by attempting to carry out some form of bus activity using the bus type B protocols, at 632, followed by receiving a response from a device having a bus type B interface from across the multiplexed bus, if such a device is present at 634.

The invention has been described in conjunction with the preferred embodiment. It is evident that numerous alternatives, modifications, variations and uses will be apparent to those skilled in the art in light of the foregoing description. It will be understood by those skilled in the art that the present invention may be practiced in support of various types of electronic devices with various possible bus interfaces, and is not limited to nonvolatile memory devices having interfaces for either LPC or SPI busses. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. An apparatus comprising:
   a multiplexed bus interface;
   a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and a device having a second bus type interface, wherein the first bus type interface is a serial peripheral interface (SPI) and the second bus type interface is a low pin count (LPC) interface; and
   a first device coupled to the multiplexed bus and having the first bus type interface.

2. The apparatus of claim 1, further comprising a second device coupled to the multiplexed bus and having the second bus type interface, wherein the multiplexed bus is further comprised of a first coordinating signal line to signal the first device during a transfer with protocols and timings supporting activity for the device with the first type bus interface, and a second coordinating signal line to signal the second device during a transfer with protocols and timings supporting activity for the device with the second type bus interface.

3. The apparatus of claim 1, wherein the multiplexed bus is further comprised of a coordinating signal line to signal either one of the device having the first bus type interface and the device having the second bus type interface during a transfer with protocols and timings supporting either device having the first bus type interface or the device having the second bus type interface.

4. An apparatus comprising:
a multiplexed bus interface; a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and a device having a second bus type interface;
a first device coupled to the multiplexed bus and having the first bus type interface;
a second device coupled to the multiplexed bus and having the second bus type interface, wherein the multiplexed bus comprises a first coordinating signal line to signal the first device during a transfer with protocols and timings supporting activity for the device with the first type bus interface, and a second coordinating signal line to signal the second device during a transfer with protocols and timings supporting activity for the device with the second type bus interface, wherein one common signal line among the plurality of common signal lines transfers a clock output supplied by the multiplexed bus interface to both the first and second devices having a clock rate that is switched between a first clock rate during a transfer directed to the first device with protocols and timings supporting a device with a first bus type interface, and a second clock rate during a transfer directed to the second device with protocols and timings supporting a device with second bus type interface.

5. An apparatus comprising:
a multiplexed bus interface; a multiplexed bus coupled to and controlled by the multiplexed bus interface; wherein the multiplexed bus is comprised of a plurality of common signal lines to transfer addresses, commands and data with protocols and timings to support activity with either one of a device having a first bus type interface and a device having a second bus type interface; and
a first device coupled to the mulitplexed bus and having the first bus type interface, wherein the protocols and timings to support the device with the first bus type interface support a serial data transfer across one of the common signal lines, and wherein the protocols and timings to support a device with the second bus type interface support a parallel data transfer across the plurality of the common signal lines.

6. A computer system comprising:
a CPU;
a memory system;
a support logic coupled to both the CPU and the memory system;
a multiplexed bus interface coupled to the support logic and controllable by the CPU executing instructions;
a multiplexed bus coupled to and controlled by the multiplexed bus interface; wherein the multiplexed bus is comprised of a plurality of common signal lines to transfer addresses, commands and data with protocols and timings to support activity with either one of a device having a first bus type interface and a device having a second bus type interface, wherein the first bus type interface is a serial peripheral interface (SPI) and the second bus type interface is a low pin count (LPC) interface; and
a first device coupled to the multiplexed bus, wherein the first device is non-volatile memory device having the first bus type interface and storing a plurality of instructions to be executed by the CPU.

7. The computer system of claim 6, further comprising a second device coupled to the multiplexed bus and having the second bus type interface, wherein the second device is an I/O device, and wherein the multiplexed bus is further comprised of a first coordinating signal line to signal the first device during a transfer with protocols and timings supporting activity for the device with the first type bus interface, and a second coordinating signal line to signal the second device during a transfer with protocols and timings supporting activity for the device with the second type bus interface.

8. The computer system of claim 6, wherein the multiplexed bus is further comprised of a coordinating signal line to signal either one of the device having the first bus type interface and the device having the second bus type interface during a transfer with protocols and timings supporting either the device having the first bus type interface or the device having the second bus type interface.

9. A computer system comprising:
a CPU;
a memory system;
a support logic coupled to both the CPU and the memory system;
a multiplexed bus interface coupled to the support logic and controllable by the CPU executing instructions;
a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and device having a second bus type interface; and
a first device coupled to the multiplexed bus, wherein the first device is non-volatile memory device having the first bus type interface and storing a plurality of instructions to be executed by the CPU;
a second device coupled to the multiplexed bus and having the second bus type interface, wherein the second device is an I/O device, and wherein the multiplexed bus further comprises a first coordinating signal line to signal the first device during a transfer with protocols and timings supporting activity for the device with the first type bus interface, and a second coordinating signal line to signal the second device during a transfer with protocols and timings supporting activity for the device with the second type bus interface, wherein one common signal line among the plurality of common signal lines transfers a clock output supplied by the multiplexed bus interface to both the first and second devices having a clock rate that is switched between a first clock rate during a transfer directed to the first device with protocols and timings supporting the device with the first bus type interface, and a second clock rate during a transfer directed to the second device with protocols and timings supporting the device with the second bus type interface.

10. A computer system comprising:
a CPU;
a memory system;
a support logic coupled to both the CPU and the memory system;

a multiplexed bus interface coupled to the support logic and controllable by the CPU executing instructions;

a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and device having a second bus type interface; and a first device coupled to the multiplexed bus, wherein the first device is non-volatile memory device having the first bus type interface and storing a plurality of instructions to be executed by the CPU;

a second device coupled to the multiplexed bus and having the second bus type interface, wherein the second device is an I/O device, and wherein the multiplexed bus further comprises a first coordinating signal line to signal the first device during a transfer with protocols and timings supporting activity for the device with the first type bus interface, and a second coordinating signal line to signal the second device during a transfer with protocols and timings supporting activity for the device with the second type bus interface, wherein the CPU is able to execute instructions causing the CPU to control the multiplexed bus interface to test for presence of devices on the multiplexed bus having the first bus type interface causing the first device to be detected, and wherein the CPU executes instructions causing the CPU to control the multiplexed bus interface to test for the presence of devices on the multiplexed bus having the second bus type interface, causing the second device to be detected.

11. A computer system comprising:

a CPU;

a memory system;

a support logic coupled to both the CPU and the memory system;

a multiplexed bus interface coupled to the support logic and controllable by the CPU executing instructions;

a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and device having a second bus type interface; and a first device coupled to the multiplexed bus, wherein the first device is non-volatile memory device having the first bus type interface and storing a plurality of instructions to be executed by the CPU;

a second device coupled to the multiplexed bus and having the second bus type interface, wherein the second device is an I/O device, and wherein the multiplexed bus further comprises a first coordinating signal line to signal the first device during a transfer with protocols and timings supporting activity for the device with the first type bus interface, and a second coordinating signal line to signal the second device during a transfer with protocols and timings supporting activity for the device with the second type bus interface, wherein the multiplexed bus interface is able to execute instructions causing the multiplexed bus interface to test for the presence of devices on the multiplexed bus having the first bus type interface causing the first device to be detected, wherein the multiplexed bus interface tests for the presence of devices on the multiplexed bus having the second bus type interface, causing the second device to be detected, and wherein the multiplexed bus interface is able to provide the CPU with an indication that both the first and second devices were detected.

12. A computer system comprising:

a CPU;

a memory system;

a support logic coupled to both the CPU and the memory system;

a multiplexed bus interface coupled to the support logic and controllable by the CPU executing instructions;

a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and device having a second bus type interface; and a first device coupled to the multiplexed bus, wherein the first device is non-volatile memory device having the first bus type interface and storing a plurality of instructions to be executed by the CPU;

a second device coupled to the multiplexed bus and having the second bus type interface, wherein the second device is an I/O device, and wherein the multiplexed bus further comprises a first coordinating signal line to signal the first device during a transfer with protocols and timings supporting activity for the device with the first type bus interface, and a second coordinating signal line to signal the second device during a transfer with protocols and timings supporting activity for the device with the second type bus interface, wherein the protocols and timings to support the device with the first bus type interface support a serial data transfer across one of the common signal lines, and wherein the protocols and timings to support the device with the second bus type interface support a parallel data transfer across the plurality of the common signal lines.

13. A computer system comprising:

a CPU;

a memory system;

a support logic coupled to both the CPU and the memory system;

a multiplexed bus interface coupled to the support logic and controllable by the CPU executing instructions;

a multiplexed bus coupled to and controlled by the multiplexed bus interface, wherein the multiplexed bus is comprised of a plurality of common signal lines to transfer addresses, commands and data with protocols and timings to support activity with either one of a device having a first bus type interface and device having a second bus type interface; and a first device coupled to the multiplexed bus, wherein the first device is non-volatile memory device having the first bus type interface and storing a plurality of instructions to be executed by the CPU, wherein the CPU is able to execute instructions causing the CPU to control the multiplexed bus interface to test for presence of devices on the multiplexed bus having the first bus type interface causing the first device to be detected.

* * * * *